United States Patent
Lee

(10) Patent No.: US 9,627,069 B1
(45) Date of Patent: Apr. 18, 2017

(54) SEMICONDUCTOR MEMORY DEVICE AND OPERATING METHOD THEREOF

(71) Applicant: SK hynix Inc., Icheon-si, Gyeonggi-do (KR)

(72) Inventor: Hee Youl Lee, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/060,044

(22) Filed: Mar. 3, 2016

(30) Foreign Application Priority Data

Oct. 7, 2015 (KR) ........................ 10-2015-0141035

(51) Int. Cl.
- *G11C 8/12* (2006.01)
- *G11C 7/18* (2006.01)
- *G11C 16/08* (2006.01)
- *G11C 16/12* (2006.01)

(52) U.S. Cl.
CPC .............. *G11C 16/08* (2013.01); *G11C 16/12* (2013.01)

(58) Field of Classification Search
USPC ............. 365/230.04, 185.25, 185.19, 230.03
See application file for complete search history.

(56) References Cited

U.S. PATENT DOCUMENTS

| | | | |
|---|---|---|---|
| 2003/0043686 A1 | 3/2003 | Lee et al. | |
| 2009/0190406 A1* | 7/2009 | Tanzawa | G11C 16/26 365/185.19 |
| 2009/0251953 A1* | 10/2009 | Choi | G11C 8/08 365/163 |
| 2009/0273984 A1* | 11/2009 | Tanzawa | G11C 16/0483 365/185.25 |
| 2014/0043929 A1* | 2/2014 | Jang | G11C 8/10 365/230.04 |

FOREIGN PATENT DOCUMENTS

| | | |
|---|---|---|
| KR | 1020090088125 A | 8/2009 |
| KR | 1020130125570 A | 11/2013 |

* cited by examiner

*Primary Examiner* — Hoai V Ho
*Assistant Examiner* — Minh Dinh
(74) *Attorney, Agent, or Firm* — William Park & Associates Ltd.

(57) ABSTRACT

A semiconductor memory device includes a memory cell array including a plurality of memory cells, connecting circuits including pass transistors coupled between global word lines and the plurality of memory cells, an address decoder coupled to block word lines coupled to gates of the pass transistors and the global word lines, and a control logic controlling the address decoder and applying a voltage pulse to the global word lines and the block word lines according to an operation state of the semiconductor memory device.

20 Claims, 11 Drawing Sheets

SEMICONDUCTOR MEMORY DEVICE AND OPERATING METHOD THEREOF

CROSS-REFERENCE TO RELATED APPLICATION

The present application claims priority to Korean patent application 10-2015-0141035 filed on Oct. 7, 2015 in the Korean Intellectual Property Office, the entire disclosure of which is incorporated by reference herein.

BACKGROUND

1. Technical Field

An aspect of the disclosure relates to an electronic device, and more particularly, to a semiconductor memory device and an operating method thereof.

2. Related Art

A semiconductor memory device is a memory device embodied by using semiconductors such as silicon (Si), germanium (Ge), gallium arsenide (GaAs), and indium phosphide (InP). The semiconductor device is divided into a volatile memory device and a nonvolatile memory device.

In the volatile memory device, data stored in the memory device disappears when the power supply is blocked. A static RAM (SRAM), a dynamic RAM (DRAM), and a synchronous DRAM (SDRAM), etc. are volatile memory devices. The nonvolatile memory device maintains data stored in the memory device although the power supply is blocked. A read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (PRAM), and a ferroelectric RAM (FRAM) are nonvolatile memory devices. Flash memory is divided into a NOR type and a NAND type.

DETAILED DESCRIPTION

Figure 1:
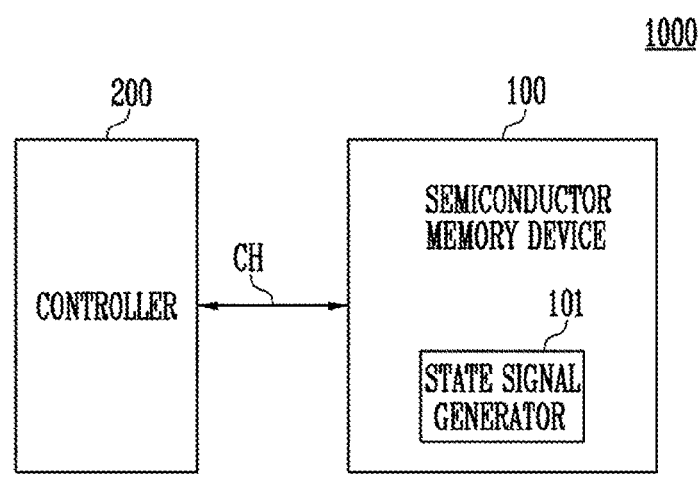
FIG. 1 is a block diagram illustrating a memory system including a memory device and a controller.

Various embodiments relate to a semiconductor memory device having an improved reliability and an operating method thereof.

According to an aspect of the disclosure, there is provided a semiconductor memory device, comprising a memory cell array including a plurality of memory cells. The semiconductor memory device may also comprise connecting circuits including pass transistors coupled between global word lines and the plurality of memory cells. The semiconductor memory device may also include an address decoder coupled to block word lines coupled to gates of the pass transistors and to the global word lines, and a control logic which applies a voltage pulse to the global word lines and the block word lines by controlling the address decoder according to an operation state of the semiconductor memory device.

According to an aspect of the disclosure, there is provided a method of operating a semiconductor memory device including a plurality of memory cells, the method comprising: determining whether an operation state of the semiconductor memory device is in a ready state of the semiconductor memory device, and applying a voltage pulse to global word lines connecting the plurality of memory cells and block word lines coupled to gates of pass transistors coupled between the global word lines and the plurality of memory cells.

Hereinafter, embodiments of the disclosure will be described with reference to the accompanying figures in detail. However, the disclosure is not limited to an embodiment disclosed below and may be implemented in various forms and the scope of the disclosure is not limited to the following embodiments. Rather, embodiments are provided to more sincerely and fully disclose the embodiments and to completely transfer a spirit of the disclosure to those skilled in the art to which the disclosure pertains, and the scope of the disclosure should be understood by the claims of the disclosure.

Example embodiments have been disclosed herein, and although specific structural or functional explanations are employed, the explanations are used and are to be interpreted in a generic and descriptive sense only and not for purpose of limitation.

In an embodiment according to the present disclosure, since various changes in form and details may be made, specific embodiments may be illustrated in drawings and described in detail in the specification. However, embodiments according to a concept of the present disclosure are not limited to a specific disclosing shape, and the scope of the disclosure should be understood by the claims of the disclosure which include all changes, distributions, and equivalents.

The term 'first' or 'second' may be used to describe various elements, but the element may be not limited by the above term. The term may be used for the purpose of distinguishing an element from the other element within the scope of the claims of the present disclosure. The first element may be named as the second element. Similarly, the second element may be named as the first element.

When an element is described as 'coupled' or 'connected' to another element, it will be understood that the element may be directly coupled or connected to the other element, but other elements may exist between them. Meanwhile, when an element is described to be 'directly coupled' or 'directly connected' to another element, it will be understood that other elements may not exist between them. Other expressions describe relations among the elements, in other words, 'between to' and 'directly between to,' or 'adjacent to' and 'directly adjacent to' may be understood in a substantially same manner.

Example embodiments have been disclosed herein, and although specific terms are employed, the example embodiments are used and are to be interpreted in a generic and descriptive sense only and not for the purpose of limitation. The singular may represent plurals unless described otherwise. The term 'include' or 'have' may represent that a described embodiment may 'include' or 'have' a described characteristic, number, state, operation, element or a combination thereof, and be it may be understood that the terms may represent at least one of other characteristics, numbers, states, operations, elements, or a combination thereof.

Unless defined otherwise, all the terms including technological terms have the same meaning understood by those of ordinary skill in the art in the technology field in which the present disclosure is involved. Terms used in general may be interpreted to have a contextual meaning, and unless defined distinctly in the specification, terms may not be understood as being excessively formal.

A description for a person with ordinary skill in the technology field in which the present disclosure is involved and irrelevant technology will be omitted. Rather, these embodiments are provided so that this disclosure will be thorough and complete, and will fully and clearly convey a scope of example embodiments to those skilled in the art.

Example embodiments will now be described more fully hereinafter with reference to the accompanying drawings;

FIG. 1 is a block diagram illustrating a memory system 1000 including a semiconductor memory device 100 and a controller 200.

Referring to FIG. 1, the memory system 1000 may include the semiconductor memory device 100 and the controller 200.

The semiconductor memory device 100 may operate in response to control of the controller 200. The semiconductor memory device 100 may include a memory cell array including a plurality of memory blocks. According to an embodiment, the semiconductor memory device 100 may be a flash memory device.

The semiconductor memory device 100 may be configured to receive a command and an address through a channel CH from the controller 200, and access a region selected by the address, among the memory cell arrays. In other words, the semiconductor memory device 100 may perform an internal operation corresponding to the command on the region selected by the address.

For example, the semiconductor memory device 100 may perform a program operation, a read operation, and a delete operation. When performing the program operation, the semiconductor memory device 100 may program data to the region selected by the address. When performing the read operation, the semiconductor device 100 may read data from the region selected by the address. When performing the delete operation, the semiconductor memory device 100 may delete data stored in the region selected by the address.

The semiconductor memory device 100 may include a state signal generator 101. The state signal generator 101 may output a state signal which represents whether the semiconductor memory device 100 is in a ready state or a busy state.

When the semiconductor memory device 100 is in the ready state, the semiconductor memory device 100 may complete an internal operation and may be in a standby mode. For example, when the semiconductor memory device 100 is in the ready state, the semiconductor memory device 100 may complete the program operation, the read operation, or the delete operation corresponding to the command.

When the semiconductor memory device 100 is in the busy state, the semiconductor memory device 100 possibly may not complete an internal operation. For example, when the semiconductor memory device 100 is in the busy state, the semiconductor memory device 100 possibly may not complete the program operation, the read operation, or the delete operation corresponding to the command.

The state signal generator 101 may output a ready busy signal RB as the state signal. The state signal generator 101 may be coupled to the controller 200 through a ready busy signal line (not illustrated) distinguishable from the channel CH, and output the ready busy signal RB through the ready busy line. For example, the ready busy signal RB disabled as a logic value 'high' may mean that the semiconductor memory device 100 may correspond to the ready state, and the ready busy signal RB enabled as a logic value 'low' may mean that the semiconductor memory device 100 may correspond to the busy state. In another example, when an output terminal of the ready busy signal RB has a high impedance, the semiconductor memory device 100 may correspond to the ready state, and when the ready busy signal RB is enabled as the logic value 'low,' the semiconductor memory device 100 may correspond to the busy state.

The controller 200 may control the semiconductor memory device 100 through the channel CH. The controller 200 may respond to a request from a host (not illustrated) and command the semiconductor memory device 100. When a state signal indicates that the semiconductor memory device 100 is in the ready state, the controller 200 may command a specific operation to the semiconductor memory device 100. When the state signal indicates that the semiconductor memory device 100 is in the busy state, the controller 200 may be in the standby state until the state signal indicates the ready state and the controller 200 may command the semiconductor memory device 100.

According to an embodiment, the controller 200 may control the semiconductor memory device 100 to perform a program operation, a read operation, or a delete operation. When performing the program operation, the controller 200 may provide a program command, the address where the data may be found and the data to the semiconductor memory device 100 through the channel CH. When performing the read operation, the controller 200 may provide a read command and the address to read from to the semiconductor memory device 100 through the channel CH.

When performing the delete operation, the controller 200 may provide a delete command and the address where the delete operation is to be performed to the semiconductor memory device 100 through the channel CH.

According to an embodiment, the controller 200 may include elements such as a random access memory (RAM), a processing unit, a host interface, and a memory interface. The RAM may use one of a cache memory and a buffer memory between the semiconductor memory device 100 and the host. The cache memory may be an operation memory of a processing unit, the semiconductor memory device 100, and the host. The processing unit may control a general operation of the controller 200.

The host interface may include a protocol to perform a data exchange between the host and the controller 200. According to an embodiment, the controller 200 may be configured to communicate with the host through at least one of various interface protocols such as an universal serial bus protocol (USB), a multimedia card protocol (MMC), a peripheral component interconnection protocol (PCI), a PCI-express protocol (PCI-E), an advanced technology attachment protocol (ATA), a serial-ATA protocol, a parallel-ATA protocol, a small computer small interface protocol (SCSI), an enhanced small disk interface protocol (ESDI), an integrated drive electronics protocol (IDE), and a private protocol, etc.

The memory interface may interface with the semiconductor memory device 100. For example, the memory interface may include a NAND interface or a NOR interface.

Figure 2:
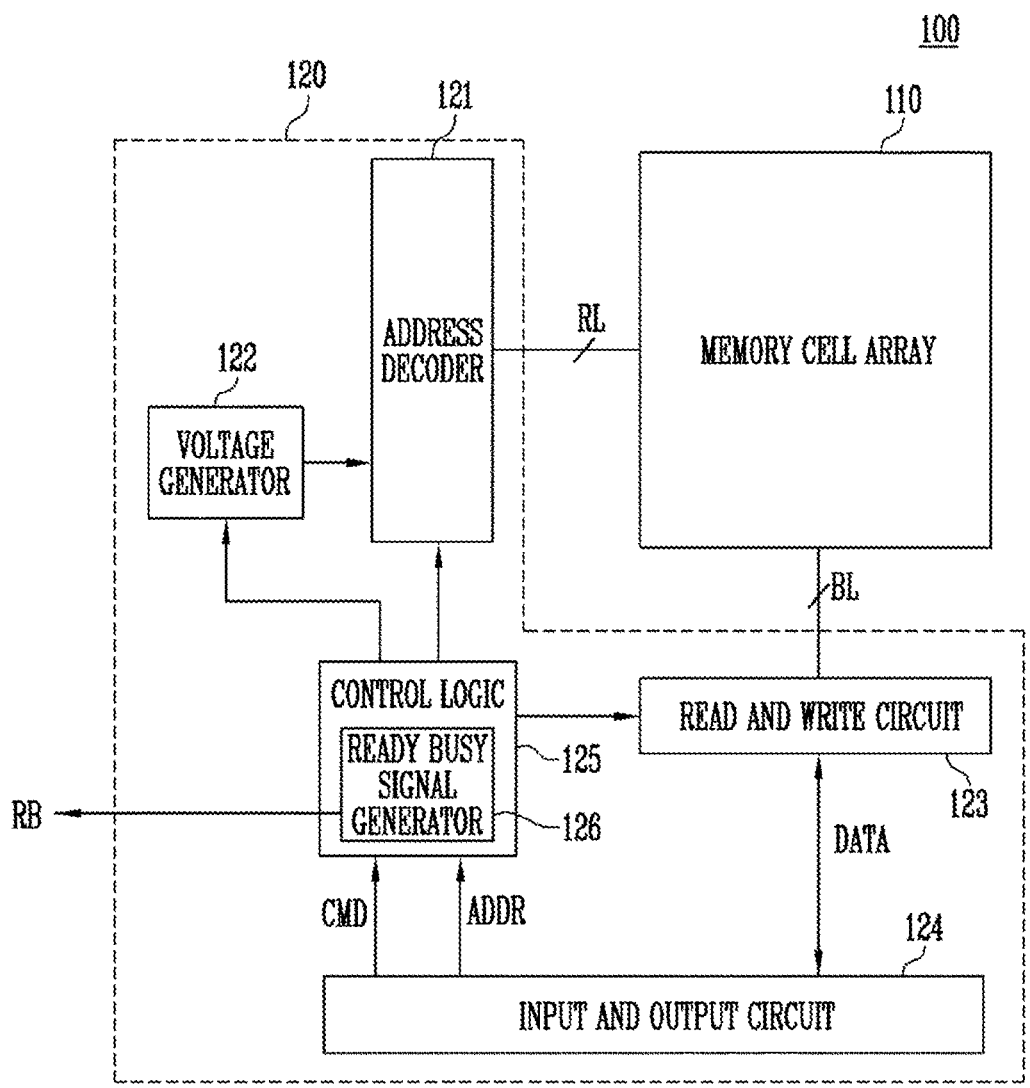
FIG. 2 is a block diagram illustrating a memory device.

FIG. 2 is a block diagram illustrating the semiconductor memory device 100.

Referring to FIG. 2, the semiconductor memory device 100 may include the memory cell array 110, and a peripheral circuit 120.

The memory cell array 110 may be coupled to an address decoder 121 through row lines RL. The memory cell array 110 may be coupled to a read and write circuit 123 through bit lines BL.

The memory cell array 110 may include a plurality of memory blocks. Each of the plurality of memory blocks may include a plurality of pages. Each of the plurality of pages may include a plurality of memory cells. According to an embodiment, the plurality of memory cells may be nonvolatile memory cells. This will be described in detail with reference to FIGS. 4 and 5.

The peripheral circuit 120 may include the address decoder 121, a voltage generator 122, a read and write circuit 123, an input and output circuit 124, and a control logic 125.

The address decoder 121 may be coupled to the memory cell array 110 through the row lines RL. The address decoder 121 may be configured to control the row lines RL in response to control of the control logic 125. The address decoder 121 may receive an address ADDR from the control logic 125.

According to an embodiment, a program operation and a read operation of the semiconductor memory device 100 may be performed based on a page unit. When performing the program operation and the read operation, the address ADDR may include a block address and a row address. The address decoder 121 may be configured to decode the block address, among the received address ADDR. The address decoder 121 may select a single memory block according to a decoded block address. The address decoder 121 may be configured to decode the row address, among the received address ADDR. The address decoder 121 may include a page of the memory block selected according to the decoded row address. The address decoder 121 will be described in greater detail with reference to FIG. 3.

According to an embodiment, the delete operation of the semiconductor memory device 100 may be performed based on a memory block unit. During the delete operation, the address ADDR may include the block address. The address decoder 121 may decode the block address, and select a single memory block according to the decoded block address.

According to an embodiment, the address decoder 121 may include a block decoder, a word line decoder, and an address buffer.

The voltage generator 122 may operate in response to control of the control logic 125. The voltage generator 122 may generate an internal power voltage by using an external power voltage supplied to the semiconductor memory device 100. For example, the voltage generator 122 may generate the internal power voltage by regulating the external power voltage. The internal power voltage may be provided to the address decoder 121, the read and write circuit 123, the input and output circuit 124, and the control logic 125 and used as an operation voltage of the semiconductor memory device 100.

The voltage generator 122 may generate a plurality of voltages by using one of the external power voltage and the internal power voltage. According to an embodiment, the voltage generator 122 may include a plurality of pumping capacitors which receive the internal power voltage, and generate the plurality of voltages by responding to control of the control logic 125 and selectively activate the plurality of pumping capacitors. For example, the voltage generator 122 may generate various voltages to be applied to the row lines RL, and provide the generated voltages to the address decoder 121.

The read and write circuit 123 may be coupled to the memory cell array 110 through the bit lines BL. The read and write circuit 123 may operate in response to control of the control logic 125.

When performing the program operation, the read and write circuit 123 may transmit data DATA from the input and output circuit 124 to the bit lines BL. The memory cells of the page selected according to the received data DATA may be programmed. When performing the read operation, the read and write circuit 123 may read the data DATA through the bit lines BL from the memory cells of the selected page, and output the read data DATA to the input and output circuit 124. When performing the delete operation, the read and write circuit 123 may float the bit lines BL.

According to an embodiment, the read and write circuit 123 may include page buffers (or page registers) and a row selection circuit.

The control logic 125 may be coupled to the address decoder 121, the voltage generator 122, the read and write circuit 123, and the input and output circuit 124. The control logic 125 may receive a command CMD and the address ADDR from the input and output circuit 124. The control logic 125 may control the semiconductor memory device 100 to perform internal operations corresponding to the command CMD. The control logic 125 may transmit the address ADDR to the address decoder 121 to control the address decoder 121.

The control logic 125 may include a ready busy signal generator 126. The ready busy signal generator 126 may correspond to the state signal generator 101 described referring to FIG. 1. The control logic 125 may internally transmit information regarding an operation state of the semiconductor memory device 100 to the ready busy signal generator 126. The ready busy signal generator 126 may be configured to output the ready busy signal RB according to the information transmitted internally.

Figure 3:
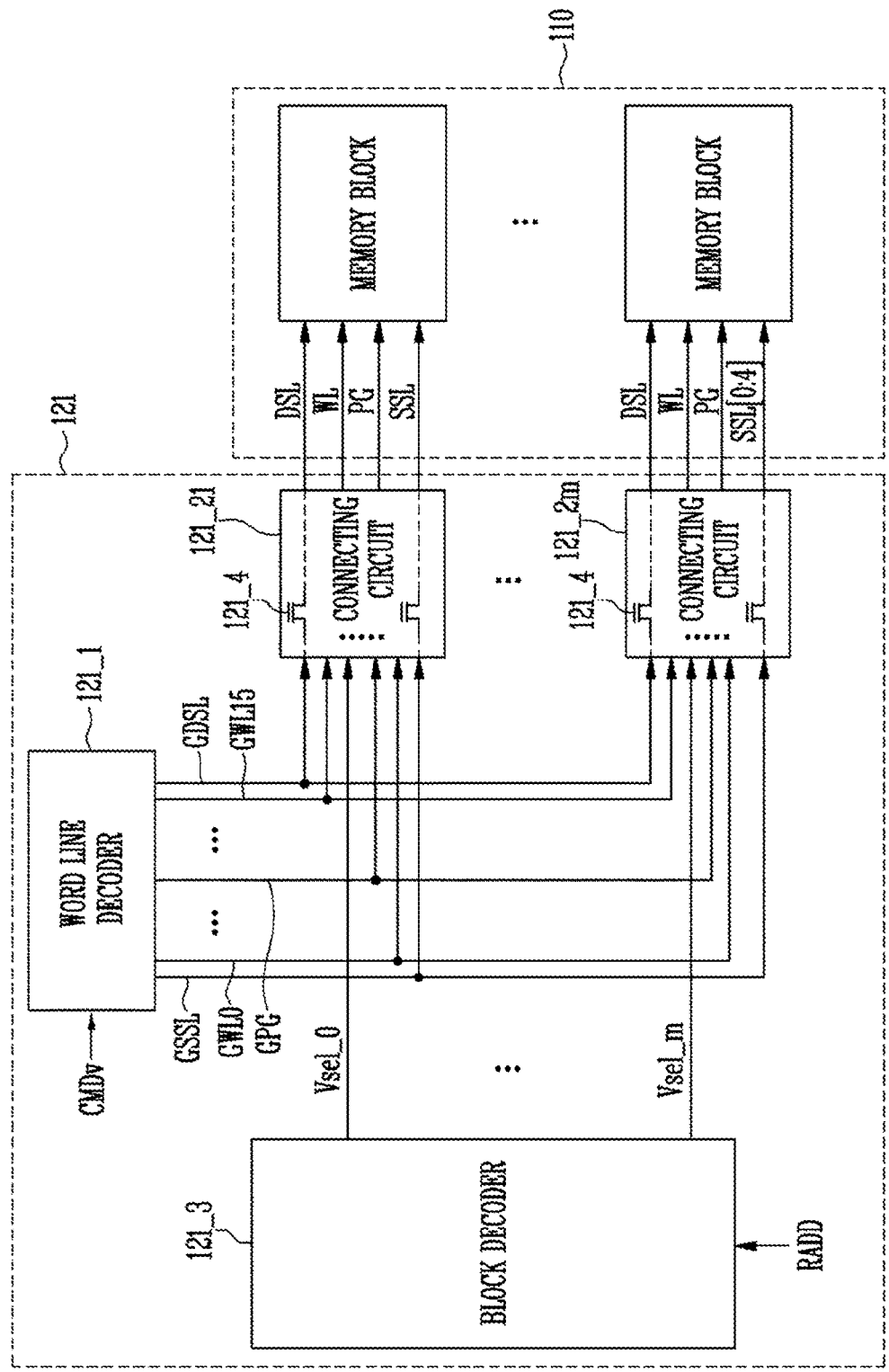
FIG. 3 is a cross-sectional view illustrating a structure of an address decoder of FIG. 2.

FIG. 3 is a plane view illustrating a structure of the address decoder of FIG. 2.

Referring to FIG. 3, the address decoder 121 of the semiconductor memory device may include a line decoder 121_1, connecting circuits 121_21 to 121_2m, and a block decoder 121_3.

The line decoder 121_1 may be configured to output operation voltages to global lines GSSL, GWL0 to GWL15, GPG and GDSL in response to a signal CMDv received from the control logic 125. For example, the line decoder 121_1 may output the operation voltages for a program roof, the read operation, and a delete roof of the memory cells to the global lines GSSL, GWL0 to GWL15, GPG and GDSL.

The connecting circuits 121_21 to 121_2m may be coupled between the global lines GSSL, GWL0 to GWL15, GPG and GDSL and local lines SSL, WL0 to WL15, PG and DSL of the memory blocks, respectively, and operate in response to block selection signals Vsel_0 to Vsel_m of the block decoder 121_3. In other words, the operation voltages (for example, the program voltage, the delete voltage, the read voltage, a pass voltage, a pipe gate voltage, and a verification voltage, etc.) which are output from the line decoder 121_1 to the global lines GSSL, GWL0 to GWL15, GPG and GDSL may be transmitted to the local lines SSL, WL0 to WL15, PG and DSL of the selected memory block. The connecting circuits 121_21 to 121_2m may selectively connect the global lines GSSL, GWL0 to GWL15, GPG and GDSL with the local lines SSL, WL0 to WL15, PG and DSL of the selected memory block of the memory cell array 110 in response to the block selection signals Vsel_0 to Vsel_m of the block decoder 121_3.

Each of the connecting circuits 121_21 to 121_2m may include transistors respectively coupled between the global lines GSSL, GWL0 to GWL15, GPG and GDSL and the local lines SSL, WL0 to WL15, PG and DSL of the memory block including a plurality of memory cells. The connecting transistors may be a pass transistor 121_4. The connecting circuits 121_21 to 121_2m may connect the global lines GSSL, GWL0 to GWL15, GPG and GDSL with the local word lines WL0 to WL15 according to the block selection signals Vsel_0 to Vsel_m. The block selection signals Vsel_0 to Vsel_m may pass through gates, for example, of the pass transistors 121_4 coupled to block word lines and global word lines GWL0 to GWL15 and the plurality of memory cells. Further, the block selection signals Vsel_0 to Vsel_m may have a higher voltage level than a threshold voltage of the pass transistors 121_4.

The connecting circuits 121_21 to 121_2m may be included in each of the memory blocks of the flash memory device, and the connecting circuits 121_21 to 121_2m may selectively operate in response to the block selection signals Vsel_0 to Vsel_m of the block decoder 121_3. For example, a single connecting circuit among the connecting circuits 121_21 to 121_2m selected by the block selection signals Vsel_0 to Vsel_m of the block decoder 121_3 may selectively operate. The block selection signals Vsel_0 to Vsel_m may be applied through the block word line coupled to the connecting circuits 121_21 to 121_2m.

The block decoder 121_3 may respectively output the block selection signals Vsel_0 to Vsel_m to the connecting circuits 121_21 to 121_2m responding to a row address signal RADD. According to the row address signal RADD, a single signal of the block selection signals Vsel_0 to Vsel_m may be activated and the rest of the signals may be deactivated. The connecting circuits 121_21 in which the activated block selection signal Vsel_0 is input may transmit operation voltages of the global lines GSSL, GWL0 to GWL15, GPG and GDSL to the memory block selected without a voltage drop. The connecting circuits 121_2m in which the deactivated block selection signals Vsel_m are input may prevent the operation voltages output to the global lines GSSL, GWL0 to GWL15, GPG and GDSL from being transmitted to the memory block.

Meanwhile, referring to FIGS. 1. and 2, the ready busy signal generator 126 of the control logic 125 may control the voltage generator 122 and the address decoder 121 to enable a bias voltage to be applied to the memory cell array when a signal in the ready state is output.

In detail, when the signal in the ready state is output from the ready busy signal generator 126, the control logic 125 may control the voltage generator 122 and the address decoder 121 to apply a first voltage to the global word lines GWL0 to GWL15 coupled to the line decoder 121_1. In addition, the control logic 125 may control the block decoder 121_3, the voltage generator 122, and the address decoder 121 to enable a second voltage to be applied to the connecting circuits 121_21 to 121_2m.

Figure 4:
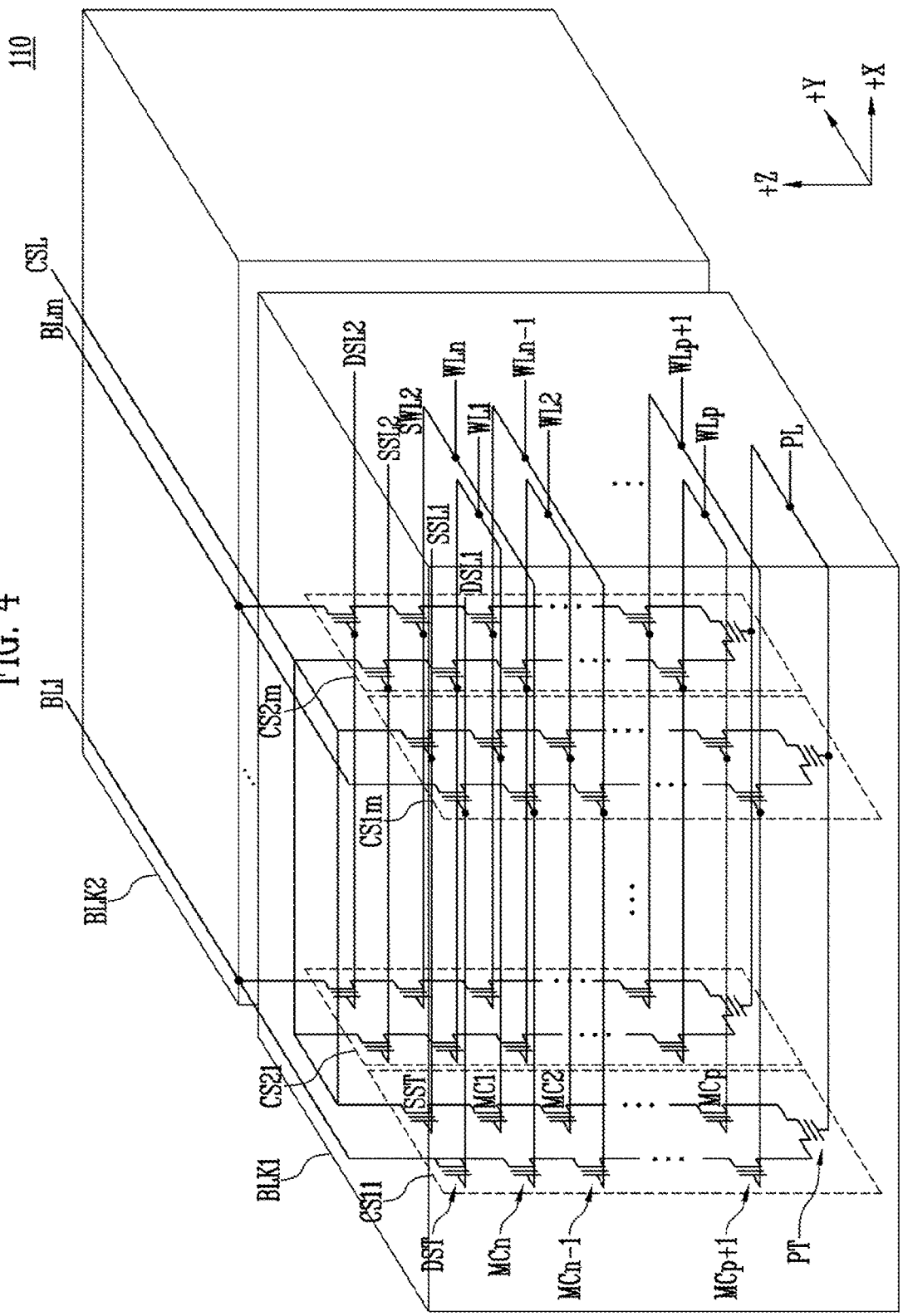
FIG. 4 is a plane view illustrating an embodiment of a memory cell array of FIG. 2.

FIG. 4 is a plane view illustrating an embodiment of the memory cell array of FIG. 2.

Referring to FIG. 4, the memory cell array 110 may include a plurality of memory blocks BLK1 to BLKz. In FIG. 4, an internal configuration of a first memory block BLK1 may be illustrated for the convenience of understanding, and the internal configuration of the rest of the memory blocks BLK2 to BLKz may be omitted. The second to zth memory blocks BLK2 to BLKz may be configured in a substantially same manner as the first memory block BLK1.

Referring to FIG. 4, the first memory block BLK1 may include a plurality of cell strings CS11 to CS1m and CS21 to CS2m. According to an embodiment, each of the plurality of cell strings CS11 to CS1m and CS21 to CS2m may be formed in a U shape. In the first memory block BLK1, m cell strings may be arranged in a row direction. (In other words, +X direction). In FIG. 4, two of the cell strings arranged in the row direction is illustrated. It is for the convenience of explanation that at least 3 cell strings may be arranged in the row direction per memory block BLK1 to BLKz.

Each of the plurality of cell strings CS11 to CS1m and CS21 to CS2m may include at least one source selection transistor SST, first to nth memory cells MC1 to MCn, a pipe transistor PT, and at least one drain selection transistor DST.

The selection transistors SST and DST and each of the memory cells MC1 to MCn may have structures similar to each other. According to an embodiment, each of the selection transistors SST and DST and the memory cells MC1 to MCn may have a channel layer, a tunnel insulating layer, a charge storage layer, and a blocking insulating layer. According to an embodiment, a pillar which provides at least one channel layer, the tunnel insulating layer, the charge storage layer, and the blocking insulating layer may be provided to each cell string.

The source selection transistor SST of each cell string may be coupled between a common source line CSL and the memory cells MC1 to MCp.

According to an embodiment, the source selection transistors SST of cell strings arranged in the same row may be coupled to a source selection line extended in the row direction, and the source selection transistor SST of the cell strings arranged in different rows may be coupled to different source selection lines. In FIG. 4, the source selection transistors SST of the cell strings CS11 to CS1m in a first row may be coupled to a first source selection line SSL1. The source selection transistors of the cell strings CS21 to CS2$m$ in a second row may be coupled to a second source selection line SSL2.

According to another embodiment, the source selection transistors SST of the cell strings CS11 to CS1$m$ and CS21 to CS2$m$ may be coupled in common to a single source selection line.

The first to the nth memory cells MC1 to MCn of each cell string may be coupled between the source selection transistor SST and the drain selection transistor DST.

The first to the nth memory cells MC1 to MCn may be divided into the first to pth memory cells MC1 to MCp and p+1th to the nth memory cells MCp+1 to MCn. The first to the pth memory cells MC1 to MCp may be arranged sequentially and in a reverse direction of +z, and coupled in series between the source selection transistor SST and the pipe transistor PT. The p+1th to the nth memory cells MCp+1 to MCn may be arranged sequentially and in a +z direction, and coupled in series between the pipe transistor PT and the drain selection transistor DST. The first to the pth memory cells MC1 to MCp and the p+1th to the nth memory cells MCp+1 to MCn may be coupled through the pipe transistor PT. Gates of the first to the nth memory cells MC1 to MCn of each cell string may be coupled to the first to the nth word lines WL1 to WLn, respectively.

According to an embodiment, at least one of the first to the nth memory cells MC1 to MCn may be used as a dummy memory cell. When a dummy memory cell is provided, the voltage and the current of the corresponding cell string may be controlled stably. Accordingly, reliability of data stored in the memory block BLK1 may be improved.

A gate of the pipe transistor PT of each cell string may be coupled to a pipe line PL.

The drain selection transistor DST of each cell string may be coupled between the corresponding bit line BL and the memory cells MCp+1 to MCn. The cell strings arranged in the row direction may be coupled to the drain selection line DSL extended in the row direction. The drain selection transistors of the cell strings CS11 to CS1$m$ in the first row may be coupled to a first drain selection line DSL1. The drain selection transistors of the cell strings CS21 to CS2$m$ in a second row may be coupled to a second drain selection line DSL2.

The cell strings arranged in the column direction may be coupled to the bit line BL extended in the column direction. In FIG. 4, the cell strings CS11 and CS21 in a first column may be coupled to a first bit line BL1. The cell strings CS1$m$ and CS2$m$ in mth line may be coupled to mth bit line BLm.

The memory cells coupled to a same word row in the cell strings arranged in the row direction may constitute a single page. For example, the memory cells coupled to a first word line WL1, among the cell strings CS11 to CS1$m$ in the first row may constitute a page. The memory cells coupled to a first word line WL1, among the cell strings CS21 to CS2$m$ in the second row may constitute another page. The cell strings arranged in a row direction may be selected by selecting one of the drain selection lines DSL1 and DSL2. A page of the cell strings may be selected by selecting one of the word lines WL1 to WLn.

Figure 5:
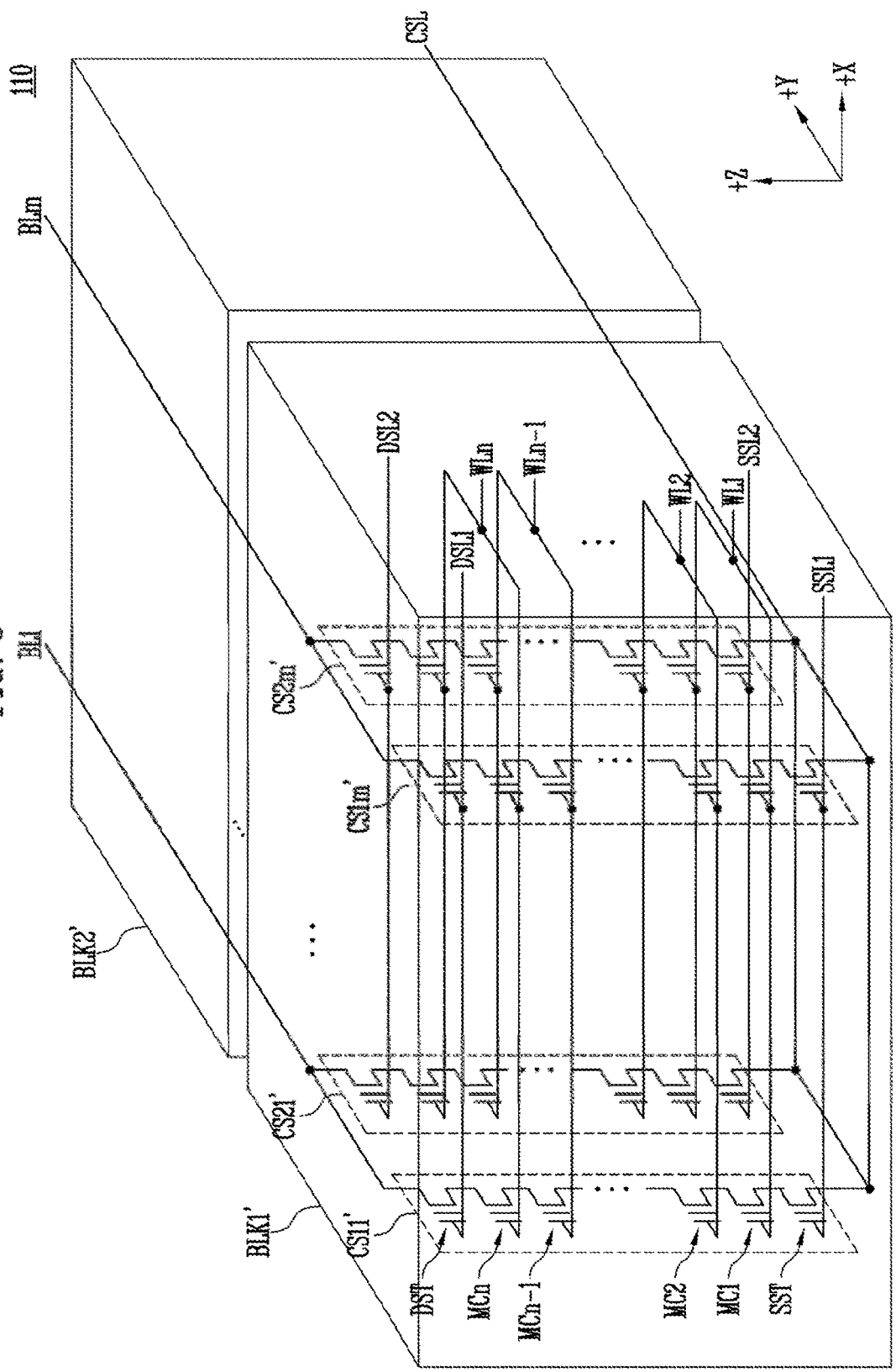
FIG. 5 is a plane view illustrating another embodiment of the memory cell array of FIG. 2.

FIG. 5 is a block view illustrating another embodiment of the memory cell array 110 of FIG. 2.

Referring to FIG. 5, the memory cell array 110 may include a plurality of memory blocks BLK1' to BLKz'. In FIG. 5, for the convenience of understanding, the internal configuration of the first memory block BLK1' may be illustrated, and the internal configuration of the rest of the memory blocks BLK2' to BLKz' may be omitted. Second to zth memory blocks BLK2' to BLKz' may be configured in a substantially same manner as the first memory block BLK1'.

The first memory block BLK1' may include a plurality of cell strings CS11' to CS1$m$' and CS21' to CS2$m$'. Each of the plurality of cell strings CS11' to CS1$m$' and CS21' to CS2$m$' may be extended in the +Z direction. M cell strings may be arranged in the +X direction in the first memory block BLK1'. In FIG. 5, two cell strings arranged in the +Y direction are illustrated. However, it is for the convenience of understanding, and 3 or more cell strings may be arranged in the +Y direction.

Each of the plurality of cell strings CS11' to CS1$m$' and CS21' to CS2$m$' may include at least one source selection transistor SST, the first to the nth memory cells MC1 to MCn, and at least one drain selection transistor DST.

The source selection transistor SST of each cell string may be coupled between the common source line CSL and the memory cells MC1 to MCn. The source selection transistors SST of the cell strings CS11' to CS1$m$' may be arranged in the same row and may be coupled to the same source selection line SSL1. The source selection transistors SST of the cell strings CS11' to CS1$m$' arranged in the first row may be coupled to the first source selection line SSL1. The source selection transistors SST of the cell strings CS21' to CS2$m$' arranged in the second row may be coupled to the second source selection line SSL2. According to another embodiment, the source selection transistors of the cell strings CS11' to CS1$m$' and CS21' to CS2$m$' may be coupled to a single source selection line.

The first to the nth memory cells MC1 to MCn of each cell string may be coupled in series between the source selection transistor SST and the drain selection transistor DST. The gates of the first to the nth memory cells MC1 to MCn may be coupled to the first to the nth word lines WL1 to WLn, respectively.

According to an embodiment, at least one of the first to the nth memory cells MC1 to MCn may be used as a dummy memory cell. When a dummy memory cell is provided, the voltage or the current of the corresponding cell string may be controlled stably. Accordingly, the reliability of data stored in the memory block BLK1' may be improved.

The drain selection transistor DST of each cell string may be coupled between the corresponding bit line BL and the memory cells MC1 to MCn. The drain selection transistors of cell strings arranged in the row direction may be coupled to the drain selection line extended in the row direction. The drain selection transistor of cell strings CS11' to CS1$m$' in the first row may be coupled to the first drain selection line DSL1. The drain selection transistors of the cell strings CS21' to CS2$m$' in the second row may be coupled to the second drain selection line DSL2.

The memory block BLK1' of FIG. 5 may have an equivalent circuit similar to the memory block BLK1 of FIG. 4 except that the pipe transistor PT is excluded from each cell string.

Figure 6:
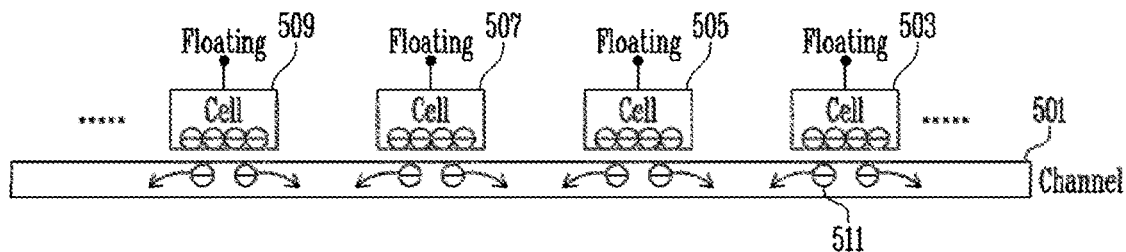
FIG. 6 is a plane view illustrating a shift phenomenon of electrons in a charge storage layer.

FIG. 6 is a plane view illustrating a shift phenomenon of electrons in a charge storage layer.

FIG. 6 schematically illustrates a structure of the plurality of memory cells 503, 505, 507 and 509 included in the cell string described in FIG. 3 or 5.

When the semiconductor memory device is in the ready state, since a potential of 0V may be applied to the global lines and the pass transistor coupled to the memory cell array, the local lines in the memory cell array are in a floating state. The memory cells 503, 505, 507 and 509 are in a programmed state in which electrons are charged in a charge storage layer CTN.

When a large number of electrons 511 are present in the channel layer 501, the electrons 511 in the channel layer 501 may push away the electrons 511 in the channel layer 501 by a repulsive power. Accordingly, since the extruded electrons may be re-input when performing a read operation, a positive Vt shift of the threshold voltage of the memory cells may occur. A shift of the threshold voltage may adversely influence the reliability of the semiconductor memory device.

In addition, when the selection line of both ends of the cell string is a floating node, the charges may be rearranged after being transitioned to the channel layer 501 by a swing feature of a selection transistor. In addition, a junction poly is the floating node, a gate-induced drain leakage (GIDL) may generate, and the volume of the charge transitioned by the internal electronic charge may be increased.

Accordingly, in the present disclosure, when the operation of the memory cell is in a disabled section, in other words, while the ready busy signal is in a state in which the logic value is 'high', the bias may be applied to the word line, and the internal electronic charge between the charge storage layer and the channel layers may be reduced.

Figure 7:
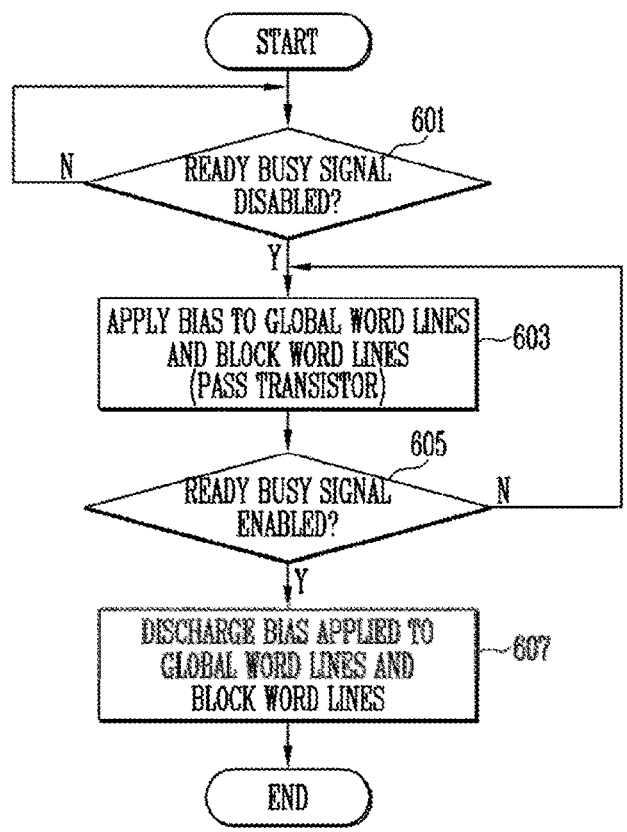
FIG. 7 is a flow chart illustrating an operation method of a semiconductor memory device according to an embodiment of the disclosure.

FIG. 7 is a flow chart illustrating operation of the semiconductor memory device according to the present disclosure.

According to FIG. 7, at step 601, the semiconductor memory device may determine whether the ready busy signal is disabled. The ready busy signal disabled having a logic value 'high' may mean that semiconductor memory device is in the ready state, and the ready busy signal enabled having a logic value 'low' may mean that the semiconductor memory device is in the busy state.

When the semiconductor memory device is in to the ready state, the corresponding semiconductor memory device may complete a program operation, read operation, and delete operation corresponding to the command.

When the semiconductor memory device is in the busy state, the corresponding semiconductor memory device may perform an internal operation. For example, when the semiconductor memory device is in the busy state, the semiconductor memory device performs a program operation, read operation, and delete operation corresponding to the command.

As a result of the determination at step 601, when the ready busy signal is disabled, the semiconductor memory device proceeds to step 603. Otherwise, since the semiconductor memory device may not complete the internal operation, the semiconductor memory device may consistently determine whether the ready busy signal is disabled at step 601 until the ready busy signal is disabled.

At step 603, the semiconductor memory device may apply the bias to the global word lines and block the word line (pass transistor). In detail, the semiconductor memory device may apply the first voltage to the global word lines and the second voltage to the block word lines.

The level of the first voltage may be the same or higher than the level of the second voltage. In addition, the second voltage may be higher than threshold voltage of the pass transistors to turn on the pass transistors in which the block word lines are coupled to each other.

According to various embodiments, the level of the second voltage may be higher than the level of the first voltage. In the ready state, the bias may be applied to the word lines of the memory cell array may be applied to suppress a charge redistribution phenomenon described in FIG. 6, and the level of the first voltage and the level of the second voltage are not limited to the described condition.

At step 605, the semiconductor memory device may determine whether the ready busy signal is enabled. The foregoing is done to apply the first and second voltages to the global word lines and the block word lines during the ready state.

As a result, when the ready busy signal is not enabled, the semiconductor memory device may proceed to step 603 and consistently apply the bias.

The semiconductor memory device may proceed to step 607 when the ready busy signal is enabled.

At step 607, the semiconductor memory device may discharge the bias applied to the global word lines and the block word lines. As shown in FIG. 7, the semiconductor memory device may start discharging after affirmative confirmation of an enabled ready busy signal. Although not illustrated, the semiconductor memory device may start discharging while inputting a command, address, and data input to the semiconductor memory device during a disable state so that a potential of each of the global line and the block word line may reach a ground state during an enable period of the ready busy signal.

According to various embodiments, a voltage level of the global word lines and the block word line may possibly not be discharged to 0V, but may be discharged to a positive low-voltage level.

The various embodiments of the first and second voltages applied to the global word lines and the block word lines will be described.

Figure 8:
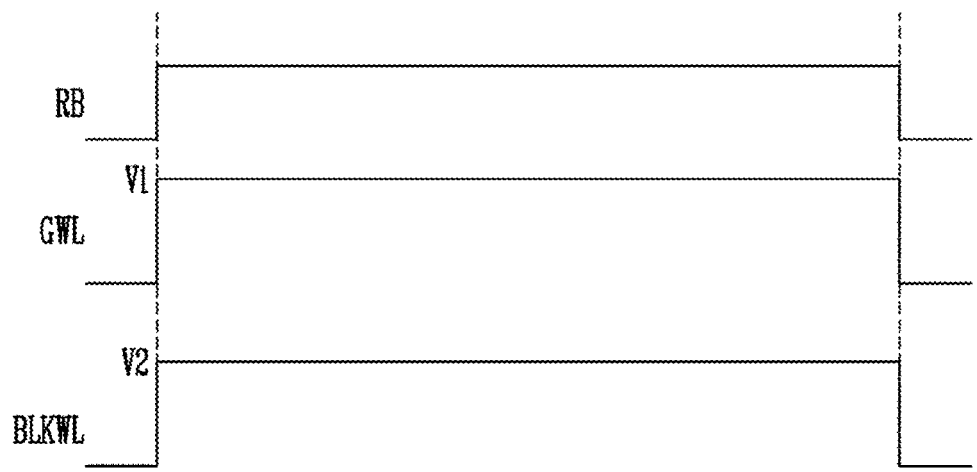
FIG. 8 is a plane view illustrating an embodiment of a voltage pulse applied to a semiconductor memory device of the present disclosure.

FIG. 8 is a plane view illustrating an embodiment of a voltage pulse applied to the semiconductor memory device.

Referring to FIG. 8, when the read busy signal RB is disabled as the logic value 'high' as described in FIG. 7, the control logic 125 may apply a voltage pulse to the global word lines GWL and block word lines BLKWL, respectively. The address decoder 121 may be coupled to the block word lines BLKWL. The first voltage pulse V1 may be applied to the global word lines GWL, and the second voltage pulse V2 may be applied to the block word lines BLKWL. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When the voltage pulse is applied to the global word lines GWL and the block word line BLKWL, the pass transistors coupled to the block word lines BLKWL may be turned on, and the first voltage pulse V1 applied to the global word lines GWL may be applied to the local word lines. When the first voltage pulse V1 is applied to a local word line, an internal electronic charge between the charge storage layer and the channel layer may be reduced.

In FIG. 8, the voltage pulse may be applied to the global word lines GWL and the block word lines BLKWL, respectively to adapt the disable section of the ready busy signal RB. When the ready busy signal RB is enabled, the semiconductor memory device may discharge the voltages of the global word lines GWL and the block word lines BLKWL. The voltages of the global word lines GWL and the block word lines BLKWL may be discharged to have a lower voltage level having a predetermined positive value rather than 0V.

Figure 9:
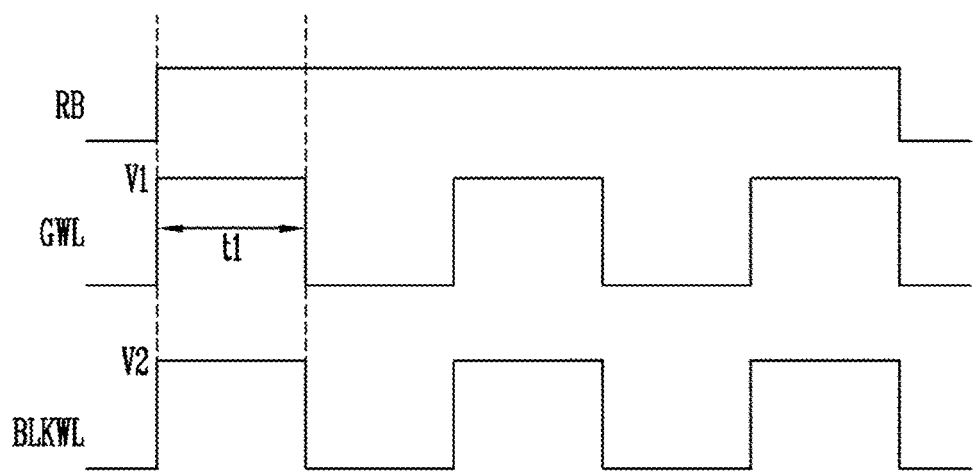
FIG. 9 is a plane view illustrating another embodiment of a voltage pulse applied to a semiconductor memory device of the present disclosure.

FIG. 9 is a plane view illustrating another embodiment of a voltage pulse applied to the semiconductor memory device.

Referring to FIG. 9, when the ready busy signal RB is disabled as the logic value 'high', the semiconductor memory device may apply the bias to the global word lines GWL and the block word lines BLKWL, respectively. The first voltage pulse V1 may be applied to the global word lines GWL, and the second voltage pulse V2 may be applied to the block word lines BLKWL. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When control logic 125 applies the voltage pulse is applied to the global word lines GWL and the block word line BLKWL according to an operation state of the semiconductor memory device, the pass transistors coupled to block word lines BLKWL may be turned on, and the first voltage pulse V1 applied to the global word lines GWL may be applied to the local word lines. When the first voltage pulse V1 is applied to a local word line, the internal electronic charge between the charge storage layer and the channel layer may be reduced.

In FIG. 9, the voltage pulse may be repeatedly applied by the control logic 125 to the global word lines GWL and the block word line BLKWL at each first reference time t1 while the operation state of the semiconductor memory device 100 is in the ready state. Deterioration of the memory cell may be prevented, and power consumption may be reduced by applying the voltage pulse to the memory cell in the ready state for less time than in FIG. 8. When the ready busy signal RB is enabled, the semiconductor memory device may discharge voltages of the global word lines GWL and the block word lines BLKWL. The voltages of the global word lines GWL and the block word lines BLKWL may be discharged to have a lower voltage level having a predetermined positive value rather than 0V.

Figure 10:
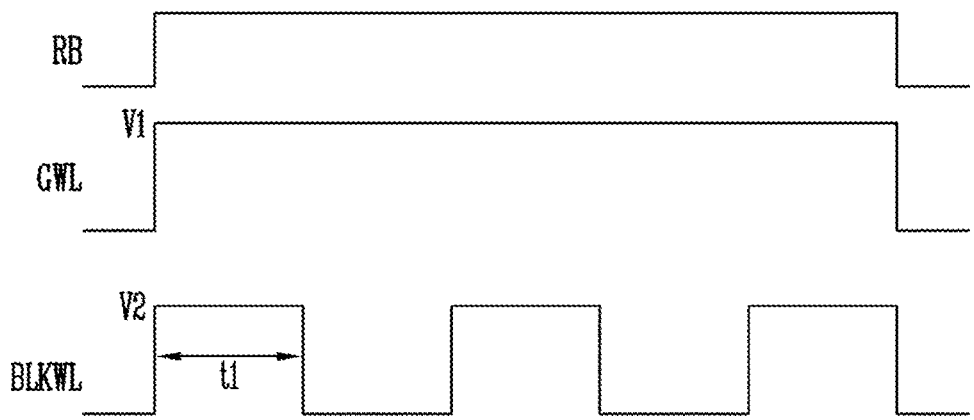
FIG. 10 is a plane view illustrating another embodiment of a voltage pulse applied to a semiconductor memory device of the present disclosure.

FIG. 10 is a plane view illustrating another embodiment of a voltage pulse applied to the semiconductor memory device.

Referring to FIG. 10, when the ready busy signal RB is disabled as the logic value 'high', the semiconductor memory device may apply the bias to the global word lines GWL and the block word lines BLKWL, respectively. The first voltage pulse V1 may be applied to the global word lines GWL, and the second voltage pulse V2 may be applied to the block word lines BLKWL. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When the voltage pulse is applied to the global word lines GWL and the block word line BLKWL by the control logic 125, the pass transistors coupled to the block word lines BLKWL may be turned on, and the first voltage pulse V1 applied to the global word lines GWL may be applied to the local word lines. When the first voltage pulse V1 is applied a local word line, the internal electronic charge between the charge storage layer and the channel layer may be reduced.

In FIG. 10, the first voltage pulse V1 may be consistently applied to the global word lines GWL by the control logic 125 in the disable section of the ready busy signal RB, and the second voltage pulse V2 may be repeatedly applied by the control logic 125 to the block word lines BLKWL at each first reference time t1 and the second voltage pulse V2 may periodically turn on the pass transistors. According to an embodiment of FIG. 10, power consumption may be reduced by consistently applying the second voltage pulse V2 to the block word lines BLKWL. The effect of reducing the internal electric field between the charge storage layer and the channel layer may be increased by consistently applying the first voltage pulse V1 in the disable section. When the ready busy signal RB is enabled, the semiconductor memory device may discharge voltages of the global word lines GWL and the block word lines BLKWL. The voltages of the global word lines GWL and the block word lines BLKWL may be discharged to have a lower voltage level having a predetermined positive value rather than 0V.

Figure 11:
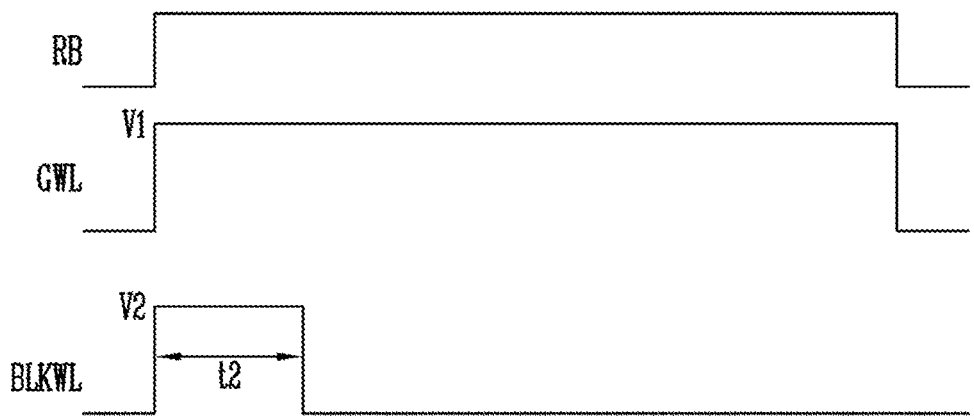
FIG. 11 is a plane view illustrating another embodiment of a voltage pulse applied to a semiconductor memory device of the present disclosure.

FIG. 11 is a plane view illustrating another embodiment of a voltage pulse applied to the semiconductor memory device.

Referring to FIG. 11, when the ready busy signal RB is disabled as the logic value 'high', the semiconductor memory device may apply the bias to the global word lines GWL and the block word lines BLKWL, respectively. The first voltage pulse V1 may be applied to the global word lines GWL, and the second voltage pulse V2 may be applied to the block word lines BLKWL. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When the voltage pulse is applied to the global word lines GWL and the block word line BLKWL by the control logic 125 according to an operation state of the semiconductor memory device, the pass transistors coupled to block word lines BLKWL may be turned on, and the first voltage pulse V1 applied to the global word lines GWL may be applied to the local word lines. When the first voltage pulse V1 is applied to a local word line, the internal electronic charge between the charge storage layer and the channel layer may be reduced.

Figure 12:
FIG. 12 is a plane view illustrating another embodiment of a voltage pulse applied to a semiconductor memory device of the present disclosure.

Unlike FIG. 12, in FIG. 11, the second voltage pulse V2 may be applied to the block word lines BLKWL during a second reference time t2, and not be applied thereafter. The second reference time t2 may be the same or longer than the first reference time t1 in FIG. 9 or 10. According to an embodiment of FIG. 11, forming the floating state after free charging the local word lines by applying and discharging the second voltage pulse V2 to the block word lines BLKWL during the second reference time t2. The semiconductor memory device may discharge voltage of the block word lines BLKWL to have a lower voltage level having a predetermined positive value rather than 0V.

According to an embodiment of FIG. 11, the power consumption may be reduced more than the embodiment of FIG. 10. The effect of reducing the internal electronic charge between the charge storage layer and the channel layer may be increased by consistently applying the first voltage pulse V1 in the disable section. When the ready busy signal RB is enabled, the semiconductor memory device may discharge voltages of the global word lines GWL. The voltages of the global word lines GWL may be discharged to have a lower voltage level having a predetermined positive value rather than 0V.

FIG. 12 is a plane view illustrating another embodiment of a voltage pulse applied to the semiconductor memory device.

Referring to FIG. 12, when the ready busy signal RB is disabled as the logic value 'high', the semiconductor memory device may apply the bias to the global word lines GWL and the block word lines BLKWL, respectively. The first voltage pulse V1 may be applied to the global word lines GWL, and the second voltage pulse V2 may be applied to the block word lines BLKWL. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When the voltage pulse is applied by the control logic 125 to the global word lines GWL and the block word line BLKWL, the pass transistors coupled to the block word lines BLKWL may be turned on, and the first voltage pulse V1 applied to the global word lines GWL may be applied to the local word lines. When the first voltage pulse V1 is applied to a local word line, the internal electronic charge between the charge storage layer and the channel layer may be reduced.

In FIG. 12, the voltage pulse may be applied to the global word lines GWL and the block word lines BLKWL, respectively adapting the disable section of the ready busy signal RB. Compared to the embodiment of FIG. 8, when the ready busy signal RB is enabled, control logic 125 of the semiconductor memory device may discharge the voltage of the global word lines GWL, and discharge the voltage of the block word lines BLKWL after a third reference time t3 after the global word lines GWL are discharged. The voltages of the global word lines GWL and the block word lines BLKWL may be discharged to have a lower voltage level having a predetermined positive value rather than 0V.

Figure 13:
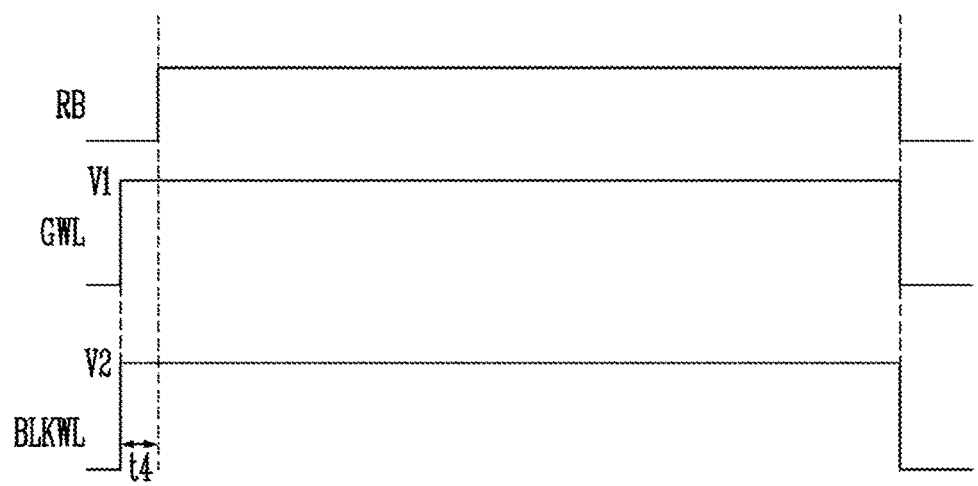
FIG. 13 is a plane view illustrating another embodiment of a voltage pulse applied to a semiconductor memory device of the present disclosure.

FIG. 13 is a plane view illustrating another embodiment of the voltage pulse applied to the semiconductor memory device.

Referring to FIG. 13, before the ready busy signal RB is disabled as the logic value 'high', the semiconductor memory device may apply the bias to the global word lines GWL and the block word lines BLKWL, respectively. In detail, the semiconductor memory device may apply the bias to the global word lines GWL and the block word lines BLKWL, respectively a fourth reference time (t4) before the ready busy signal RB is disabled. The control logic 125 may apply the first voltage pulse V1 to the global word lines GWL and the second voltage pulse V2 may be applied to the block word lines BLKWL a fourth reference time (t4) before the operation state of the semiconductor device is transitioned to a ready state. The level of the first voltage pulse V1 may be the same or higher than the level of the second voltage pulse V2. In addition, the second voltage pulse V2 may be higher than the threshold voltage of the pass transistors to turn on the pass transistors coupled to the block word lines.

When the voltage pulse is applied by the control logic 125 to the global word lines GWL and the block word line BLKWL, the pass transistors coupled to the block word lines BLKWL may be turned on, the first voltage pulse V1 applied to the global word lines GWL may be applied to the local word lines. When the voltage is applied the local word line, the internal electronic charge between the charge storage layer and the channel layer may be reduced. When the ready busy signal RB is enabled, the semiconductor memory device may discharge the voltages of the global word lines GWL and the block word lines BLKWL. The voltages of the global word lines GWL and the block word lines BLKWL may be discharged to have a lower voltage level having a predetermined positive value rather than 0V.

Figure 14:
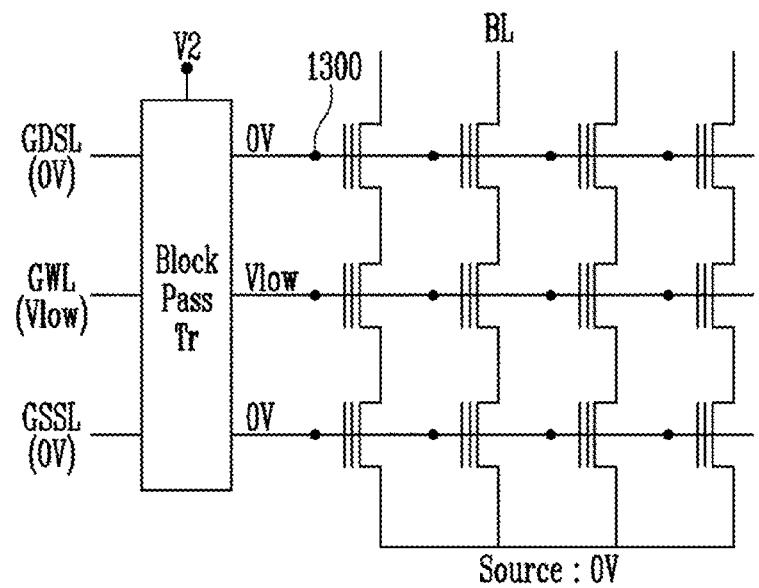
FIG. 14 is a plane view illustrating another embodiment of a voltage pulse applied to a semiconductor memory device of the present disclosure.

FIG. 14 is a plane view illustrating operation of a semiconductor memory device according to another embodiment.

FIG. 14 illustrates a voltage applied to the global word lines GWL of the memory block and the selection lines GDSL and GSSL of both ends.

In FIG. 14, in the embodiments according to FIGS. 8 to 13, the state in which the first voltage pulse V1 may be applied to the global word line GWL and the second voltage pulse V2 may be applied to the block pass transistor will be described as an example.

According to FIG. 14, the semiconductor may apply 0V to the selection lines GDSL and GSSL of both ends and turn off the selection transistors to prevent a charge from being formed in a junction poly or the charge from being transitioned to a channel layer in the cell string. In the various embodiments, the semiconductor memory device may apply 0V to the junction unit 1300 in a substantially same manner same as the selection transistor and suppress generation of the charge by GIDL in an overlap region.

Figure 15:
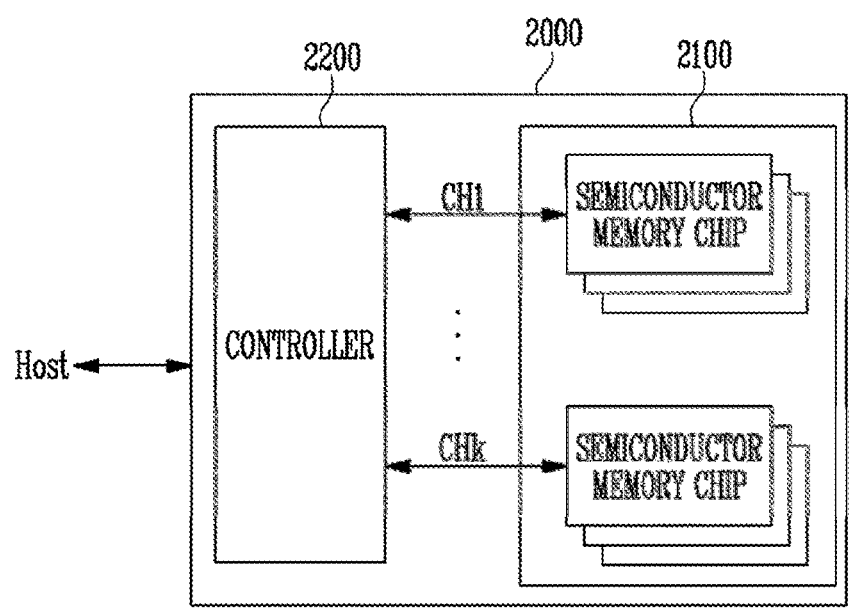
FIG. 15 is a block view illustrating an application of a memory system including a semiconductor memory device of the present disclosure.

FIG. 15 is a block view illustrating an application 2000 of the memory system 1000.

Referring to FIG. 15, the memory system 2000 may include the semiconductor memory device 2100 and the controller 2200. The semiconductor memory device 2100 may include a plurality of semiconductor memory chips. The plurality of semiconductor memory chips may be divided into the plurality of groups.

In FIG. 15, the plurality of groups may communicate with the controller 2200 through first to kth channels CH1 to CHk, respectively. Each semiconductor memory chip may be configured and operate in a substantially same manner as the semiconductor memory device 100 described referring to FIG. 4.

Each group may be configured to communicate with the controller 2200 through a common channel. The controller 2200 may be configured in a substantially same manner as the controller 2200 described with reference to FIG. 1, and configured to control the plurality of memory chips of the semiconductor memory device 2100 through the plurality of channels CH1 to CHk.

In FIG. 15, the plurality of semiconductor memory chips may be coupled to a channel. However, the memory system 2000 may be modified to connect a semiconductor memory chip to a channel.

The controller 2200 and the semiconductor memory device 2100 may be integrated as a semiconductor memory device. According to an embodiment, the controller 2200 and the semiconductor memory device 2100 may be integrated as a semiconductor memory device and constitute a memory card. For example, the controller 2200 and the semiconductor memory device 2100 may be integrated as a semiconductor memory device and constitute memory cards such as a personal computer memory card international association (PCMCIA), a compact flash card (CF), a smart media card SM and SMC, a memory stick, and a multimedia card (MMC, RS-MMC and MMCmicro), a SD card (SD, miniSD, microSD and SDHC), or a universal flash memory device UFS.

The controller 2200 and the semiconductor memory device 2100 may be integrated as a semiconductor device and constitute a solid state Drive (SSD). The solid state drive (SSD) may include a storage device configured to store data in the semiconductor memory. When the memory system 2000 is used as a solid state drive (SSD), operation speed of the host coupled to the memory system 2000 may be improved significantly.

According to another embodiment, the memory system 2000 may be provided as one of the various elements of a computer, an Ultra Mobile PC (UMPC), a workstation, a net-book, a Personal Digital Assistant (PDA), a portable computer (portable), a web tablet, a wireless phone, a mobile phone, a smart phone, an e-book, a portable multimedia player (PMP), a portable game set, a navigation device, a black box, a digital camera, a 3-dimensional television, a digital audio recorder, a digital audio player, a digital picture recorder, a digital picture player, a digital video recorder, a digital picture player, a digital video recorder, and a digital video player, a device which sends and receives information in wireless environment, one of the various electronic devices configured in a computer network, one of the various electronic devices configured in a telematics network, an RFID device, one of the various electronic devices configured in a computing system.

According to an embodiment, the semiconductor memory device 2100 or the memory system 2000 may be installed in various shapes of packages. For example, the semiconductor memory device 2100 or the memory system 2000 may be installed and/or packaged in a manner of a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline integrated circuit (SOIC), a shrink small outline package (SSOP), a thin small outline package (TSOP), a thin quad flatpack (TQFP), a system in package (SIP), a multi-chip package(MCP), a wafer-level fabricated package (WFP), and a wafer-level processed stack package(WSP).

Figure 16:
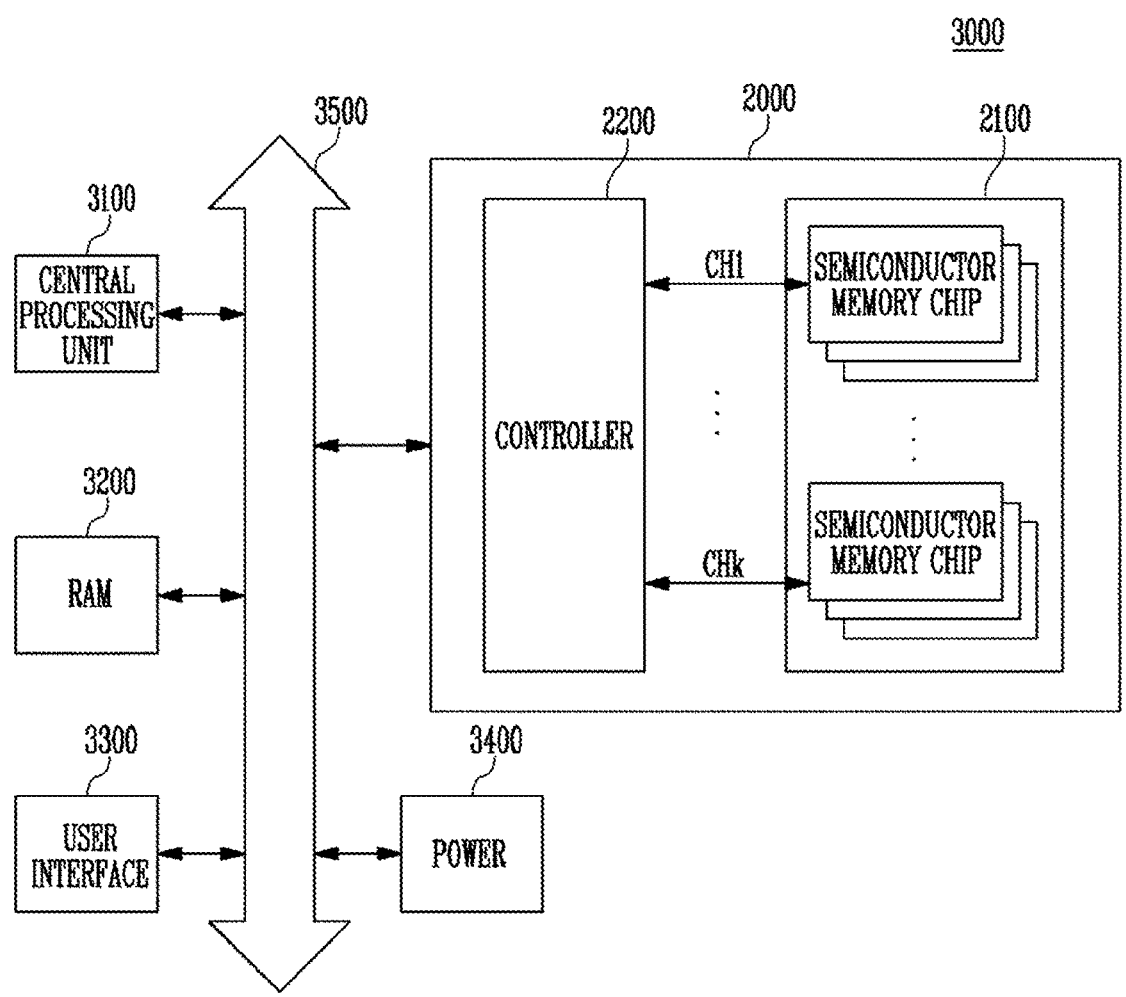
FIG. 16 is a block view illustrating a computing system including the memory system described referring to FIG. 15.

FIG. 16 is a block view illustrating a computing system 3000 including the memory system 2000 described referring to FIG. 15.

Referring to FIG. 16, the computing system 3000 may include a central processing unit 3100, a random access memory (RAM) 3200, user interface 3300, a power supply 3400, a system bus 3500, and the memory system 2000.

The memory system 2000 may be coupled to the central processing unit 3100, the random access memory (RAM) 3200, user interface 3300, and the power supply 3400 through the system bus 3500. The data provided through the user interface 3300, or processed by the central processing unit 3100 may be stored in the memory system 2000.

Referring to FIG. 16, the semiconductor memory device 2100 may be coupled to the system bus 3500 through the controller 2200. However, the semiconductor memory device 2100 may be configured to directly connect to the system bus 3500. Function of the controller 2200 may be performed by the central processing unit 3100 and the RAM 3200.

In FIG. 16, the memory system 2000 described referring to FIG. 15 may be provided. However, the memory system 2000 may be substituted for the memory system 1000 described referring to FIG. 1. According to an embodiment, the computing system 3000 may be configured to include the memory systems 1000 and 2000 described referring to FIGS. 1 and 15.

Although the present disclosure has been disclosed using limited embodiments and drawings, the present disclosure is not limited to the disclosed embodiments, and various changes in form and details may be made by those skilled in the art.

Therefore, the scope of the disclosure should be understood by the claims of the disclosure and the equivalents subsequently described.

In the embodiments, all steps may be performed or omitted. The steps may not need to be performed in order, and may be reversed. Meanwhile, the disclosure is not limited to an embodiment disclosed below and may be implemented in various forms and the scope of the disclosure is not limited to the following embodiments. Rather, the embodiments are provided to more sincerely and fully disclose the disclosure and to completely transfer a spirit of the disclosure to those skilled in the art.

Example embodiments have been disclosed herein, and although specific terms are employed, they are used and are to be interpreted in a generic and descriptive sense only and not for purpose of limitation. Various changes in form and details based on the spirit of the disclosure to those skilled in the art to which the disclosure pertains may be made by those skilled in the art.

According to an embodiment, there is provided a semiconductor memory device and an operating method thereof which has improved reliability.

What is claimed is:

1. A semiconductor memory device, comprising:
a memory cell array including a plurality of memory cells;
connecting circuits including pass transistors coupled between global word lines and the plurality of memory cells;
an address decoder coupled to block word lines coupled to gates of the pass transistors and the global word lines; and
a control logic controlling the address decoder and applying a voltage pulse to the global word lines and the block word lines according to an operation state of the semiconductor memory device,
wherein the control logic repeatedly applies the voltage pulse to at least one of the global word lines or the block word lines at each first reference time while the operation state of the semiconductor memory device is in a ready state.

2. The semiconductor memory device of claim 1, wherein the control logic applies a first voltage pulse to the global word lines, and applies a second voltage pulse to the block word lines while the operation state of the semiconductor memory device is in a ready state.

3. The semiconductor memory device of claim 2, wherein the first voltage pulse and the second voltage pulse have the same voltage level.

4. The semiconductor memory device of claim 2, wherein the first voltage pulse has a higher voltage level than the second voltage pulse.

5. The semiconductor memory device of claim 2, wherein the second voltage pulse has a higher voltage level than threshold voltages of the pass transistors.

6. The semiconductor memory device of claim 1, wherein the control logic applies a first voltage pulse to the global word lines and repeatedly applies a second voltage pulse to the block word lines at each first reference time while the operation state of the semiconductor memory device is in a ready state.

7. The semiconductor memory device of claim 1, wherein the control logic applies a first voltage pulse to the global word lines, and applies a second voltage pulse to the block word lines a fourth reference time before the operation state of the semiconductor memory device is transitioned to a ready state.

8. A semiconductor memory device, comprising:
a memory cell array including a plurality of memory cells;
connecting circuits including pass transistors coupled between global word lines and the plurality of memory cells;

an address decoder coupled to block word lines coupled to gates of the pass transistors and the global word lines; and a control logic controlling the address decoder and applying a voltage pulse to the global word lines and the block word lines according to an operation state of the semiconductor memory device, wherein the control logic applies a first voltage pulse to the global word lines, applies a second voltage pulse to the block word lines during a second reference time and discharges the global word lines and the block word lines while the operation state of the semiconductor memory device is in a ready state.

9. The semiconductor memory device of claim 8, wherein the control logic discharges the global word lines and the block word lines according to a change of the operation state of the semiconductor memory device.

10. The semiconductor memory device of claim 9, wherein the control logic discharges the global word lines when the operation state of the semiconductor memory device is transitioned from a ready state to a busy state, and discharges the block word lines when a third reference time passes after the global word lines are discharged.

11. A method of operating a semiconductor memory device including a plurality of memory cells, the method comprising:

determining whether an operation state of the semiconductor memory device is in a ready state of the semiconductor memory device;

applying a voltage pulse to global word lines connecting the plurality of memory cells and block word lines coupled to gates of pass transistors coupled between the global word lines and the plurality of memory cells; and discharging the global word lines and the block word lines according to a change of the operation state of the semiconductor memory device.

12. The method of claim 11, wherein the discharging comprises discharging the global word lines when the operation state of the semiconductor memory device is transitioned from the ready state to a busy state, and discharging the block word lines when a third reference time passes after the global word lines are discharged.

13. The method of claim 11, wherein the applying of the voltage pulse comprises applying a first voltage pulse to the global word lines while the operation state of the semiconductor memory device is in the ready state, and applying a second voltage pulse to the block word lines.

14. The method of claim 13, wherein the first voltage pulse and the second voltage pulse have the same voltage level.

15. The method of claim 13, wherein the first voltage pulse has a higher voltage level than the second voltage pulse.

16. The method of claim 13, wherein the second voltage pulse has a higher voltage level than threshold voltages of the pass transistors.

17. The method of claim 11, wherein the applying of the voltage pulse comprises repeatedly applying the voltage pulse to the global word lines and the block word lines at each first reference time while the operation state of the semiconductor memory device is in the ready state.

18. The method of claim 11, wherein the applying of the voltage pulse comprises applying a first voltage pulse to the global word lines, and repeatedly applying a second voltage pulse to the block word lines at each first reference time while the operation state of the semiconductor memory device is in the ready state.

19. The method of claim 11, wherein the applying of the voltage pulse comprises applying a first voltage pulse to the global word lines, applying a second voltage pulse to the block word lines during a second reference time and discharging the first and second voltage pulses while the operation state of the semiconductor memory device is in the ready state.

20. The method of claim 11, wherein the applying of the voltage pulse comprises applying a first voltage level to the global word lines before a fourth reference time in which the operation state of the semiconductor memory device is transitioned from the ready state to a busy state, and applying a second voltage pulse to the block word lines.

* * * * *